United States Patent [19]
Haydu et al.

[11] Patent Number: 6,024,856
[45] Date of Patent: Feb. 15, 2000

[54] COPPER METALLIZATION OF SILICON WAFERS USING INSOLUBLE ANODES

[75] Inventors: Juan B. Haydu, Orange; Elena H. Too, Branford; Richard W. Hurtubise, Clinton, all of Conn.

[73] Assignee: Enthone-OMI, Inc., West Haven, Conn.

[21] Appl. No.: 08/948,748

[22] Filed: Oct. 10, 1997

[51] Int. Cl.$^7$ .......................... C25D 21/14; C25D 21/18
[52] U.S. Cl. .......................... 205/84; 204/232; 204/237; 205/101
[58] Field of Search .......................... 205/82, 84, 101, 205/232, 237, 238, 239, 240, 241

[56] References Cited

U.S. PATENT DOCUMENTS

| | | | |
|---|---|---|---|
| H36 | 3/1986 | Smith | 205/81 |
| 4,469,564 | 9/1984 | Okinaka et al. | 205/125 |
| 4,778,572 | 10/1988 | Brown | 205/96 |
| 5,000,827 | 3/1991 | Schuster et al. | 205/118 |
| 5,100,517 | 3/1992 | Starinshak et al. | 205/138 |
| 5,143,593 | 9/1992 | Ueno et al. | 205/291 |
| 5,344,491 | 9/1994 | Katoh | 118/695 |
| 5,352,350 | 10/1994 | Andricacos et al. | 205/101 |
| 5,368,711 | 11/1994 | Poris | 204/193 |
| 5,368,715 | 11/1994 | Hurley et al. | 205/82 |
| 5,385,661 | 1/1995 | Andricacos et al. | 205/239 |
| 5,391,517 | 2/1995 | Gelatos et al. | 438/643 |
| 5,516,414 | 5/1996 | Glafenhein et al. | 205/50 |

FOREIGN PATENT DOCUMENTS

| | | |
|---|---|---|
| 0 508 212 B1 | 10/1995 | United Kingdom . |
| 0 462 943 B1 | 10/1996 | United Kingdom . |

OTHER PUBLICATIONS

Wire Journal International, "Copper Plating Insoluble Anode System for Steel Cord Process: Development of Copper Ion Supply System", Aug. 1997, pp. 82–87.

*Primary Examiner*—Kathryn Gorgos
*Assistant Examiner*—William T. Leader
*Attorney, Agent, or Firm*—DeLio & Peterson LLC; Richard P. Mueller

[57] ABSTRACT

A plating system and method is provided for electroplating silicon wafers with copper using an insoluble anode wherein the electrolyte is agitated or preferably circulated through an electroplating tank of the system and a portion of the electrolyte is removed from the system when a predetermined operating parameter is met. A copper containing solution having a copper concentration greater than the copper concentration of the removed portion is added to the copper plating system simultaneously or after electrolyte removal, in a substantially equal amount to the electrolyte removed from the system and balances the amount of copper plated and removed in the removal stream. In a preferred method and system, an electrolyte holding tank is provided which serves as a reservoir for circulating electrolyte. The addition of the copper containing solution and removal of working electrolyte is also preferably made from the holding tank. The preferred apparatus is preferably cylindrical and is specially configured so that recirculating electrolyte enters near the anode and exits near the cathode with the outlet of the apparatus having a substantially continuous opening around the periphery of the electroplating tank so that electrolyte exiting the tank has a substantially uniform flow across the surface of the cathode. The anode is preferably circular and has a central through opening through which the entering electrolyte passes.

13 Claims, 1 Drawing Sheet

COPPER METALLIZATION OF SILICON WAFERS USING INSOLUBLE ANODES

BACKGROUND OF THE INVENTION

1. Field of the Invention

This invention relates to a method and system for copper plating substrates and, in particular, to the electrolytic copper metallization of silicon wafers using insoluble anodes.

2. Description of Related Art

The demand for manufacturing semiconductor integrated circuit (IC) devices such as computer chips with high circuit speed, high packing density and low power dissipation requires the downward scaling of feature sizes in ultra-large-scale integration (ULSI) and very-large-scale integration (VLSI) structures. The trend to smaller chip sizes and increased circuit density requires the miniaturization of interconnect features which severely penalizes the overall performance of the structure because of increasing interconnect resistance and reliability concerns such as fabrication of the interconnects and electromigration.

At present, such structures use aluminum and aluminum alloys as the metallization on silicon wafers with silicon dioxide ($SiO_2$) being the dielectric material. In general, openings are formed in the $SiO_2$ dielectric layer in the shape of vias and trenches which are then metallized forming the interconnects. Increased miniaturization is reducing the openings to submicron sizes (e.g., 0.5 micron and lower).

To achieve further miniaturization of the device, however, it is being proposed to use copper instead of aluminum as the metal to form the connection lines and interconnects in the chip. Copper has a lower resistivity than aluminum and the thickness of a copper line for the same resistance can be thinner than that of an aluminum line. Copper-based interconnects will therefore represent the future trend in the fabrication of such devices.

Copper can be deposited on substrates by plating (such as electroless and electrolytic), sputtering, plasma vapor deposition (PVD) and chemical vapor deposition (CVD). It is generally recognized that a plating-based deposition is the best method to apply copper to the device since it can provide high deposition rates and low tool costs. However, plating methods must meet the stringent requirements of the semiconductor industry. For example, the copper deposits must be uniform and capable of filling the extremely small trenches and vias of the device. The plating process must also be capable of being controlled so that plating upsets are minimized or avoided and must also be compatible with clean room operations. The deposition of copper from acid copper baths is recognized in the electronics industry as the leading candidate to copper plate integrated circuit devices.

Copper electroplating, in general, involves deposition of a copper layer onto a surface by means of electrolysis using a consumable copper electrode or an insoluble anode. In the consumable electrolytic plating process, the copper electrode is consumed during the plating operation and must be replaced periodically during the plating operation. When plating using insoluble anodes, these anodes are not consumed in the plating process and do not have to be replaced. The following description will be directed to the electrolytic plating of copper using insoluble anodes.

Regardless of the method used to deposit copper on the substrate surface impurities may be co-deposited with the copper. In integrated circuit fabrication it is important that impurity particles not be present in the electrolyte but such impurities may result from sludges formed during the plating operation, impure chemicals and the like. As in all processes used to fabricate integrated circuit (IC) devices, it is necessary that such impurities be minimized and most operations are carried out in a clean room. A clean room is basically a room in which the different process steps are performed and dust particles and other impurity particles are maintained below certain levels by the use of filters and other such cleaning devices. It is important that any plating process used for the fabrication of integrated circuit devices be adaptable for use in a clean room and that the process itself minimize the impurity problems inherent in the plating process.

Bearing in mind the problems and deficiencies of the prior art, it is therefore an object of the present invention to provide an improved method and apparatus (system) for electroplating a substrate.

It is a further object of the present invention to provide an improved electrolytic method and apparatus for copper plating a silicon wafer in integrated circuit fabrication using an insoluble anode.

It is another object of the present invention to provide an electrolytic method and apparatus for copper plating a substrate including silicon wafer substrates using an insoluble anode which plating may be performed in a clean room.

It is an additional object of the invention to provide an electrolyte copper plating process having a substantially steady state electrolyte wherein the plating properties of the deposit remain constant.

Another object of the invention is to provide semiconductors and other devices electroplated with copper.

Other objects and advantages of the invention will in part be readily apparent from the following description.

SUMMARY OF THE INVENTION

Applicants have discovered an electrolytic method for copper plating a substrate, preferably a silicon wafer semiconductor substrate, comprising:

providing a plating system comprising a copper plating apparatus comprising a tank preferably having an inlet and an outlet and containing a copper electrolyte and a substrate to be plated as a cathode and a spaced apart insoluble anode;

agitating the copper electrolyte in the tank preferably by circulating the electrolyte to the inlet of the tank and simultaneously removing the copper electrolyte from the outlet of the tank, while applying a current and electroplating the cathode;

measuring at least one of the operating parameters of the plating system;

removing a portion of the electrolyte from the system when a predetermined operating parameter is met;

adding to the system either simultaneously with or after the electrolyte removal a copper containing solution having a copper concentration greater than the copper concentration in the removed electrolyte and in an amount sufficient to increase the copper concentration of the electrolyte in the system to a predetermined value and to maintain the volume of electrolyte in the system at a substantially constant volume.

In another aspect of the invention, a method is provided for the electrolytic copper plating of a substrate, preferably a silicon wafer semiconductor substrate, comprising:

providing a plating system comprising:
a copper plating tank and an electrolyte holding tank, the copper plating tank preferably being cylindrical and having an inlet preferably at the lower end of the tank and an outlet at the upper end of the tank and containing copper electrolyte and a substrate as a cathode and a spaced apart insoluble anode both the cathode and anode being preferably horizontal, the inlet and outlet preferably positioned so that an electrolyte stream enters the plating tank near the anode and exits near the cathode;

agitating the electrolyte preferably by circulating the copper electrolyte to the inlet of the apparatus from the holding tank and simultaneously removing the copper electrolyte from the outlet of the apparatus and directing the outlet copper electrolyte to the holding tank, while applying a current and electroplating the cathode;

measuring at least one of the operating parameters of the plating system;

removing a portion of electrolyte from the system when a predetermined operating parameter is met;

adding to the system either simultaneously with or after the electrolyte removal a copper containing solution having a copper concentration greater than the copper concentration in the removed electrolyte and in an amount sufficient to increase the copper concentration of the electrolyte in the system to a predetermined value and to maintain the volume of electrolyte in the system at a substantially constant volume.

In another aspect of the invention, an apparatus for electrolytic copper plating a substrate, preferably a silicon wafer, comprises:

an electroplating tank containing therein copper electrolyte, a substrate as a cathode and a spaced apart insoluble anode, the tank preferably having inlet means and outlet means;

agitating the copper electrolyte in the tank preferably by circulating the copper electrolyte through the electroplating tank from the inlet to the outlet, while applying a current and electroplating the cathode;

measuring means for measuring at least one of the operating parameters of the plating process;

removal means for removing the electrolyte from the electroplating tank when a predetermined operating parameter is met; and addition means for adding to the electroplating tank a copper containing solution having a copper concentration greater than the copper concentration of the removed electrolyte in an amount sufficient to increase the copper concentration of the electrolyte in the system to a predetermined value and to maintain the volume of electrolyte in the tank at a substantially constant volume.

In a preferred embodiment, the apparatus further comprises filtering means to filter the electrolyte and cooling/heating means to adjust the temperature of the electrolyte. It is preferred to filter the electrolyte as it enters the electroplating tank.

In another aspect of the invention, the apparatus further comprises a electrolyte holding tank from which electrolyte is pumped into the inlet of the electroplating tank and into which electrolyte is pumped from the outlet of the electroplating tank. The addition means to add the copper containing solution preferably adds the solution to the holding tank. Electrolyte removed from the system is also preferably removed from the holding tank.

In another aspect of the invention, the additive copper containing solution is packaged in a container holding a predetermined amount of solution to be added to the system and is added by means suitable for clean room operations, e.g., injecting the solution into the holding tank from the container, and the container either discarded or available for refilling and reuse. Likewise, the electrolyte which is removed from the system is preferably removed into a waste container under conditions suitable for clean room operations and which container may then be removed from the system and the contents treated outside the clean room.

BRIEF DESCRIPTION OF THE DRAWINGS

Various aspects of the present invention can be best understood by reference to the accompanying drawings in which.

DESCRIPTION OF THE PREFERRED EMBODIMENT(S)

Figure 1:
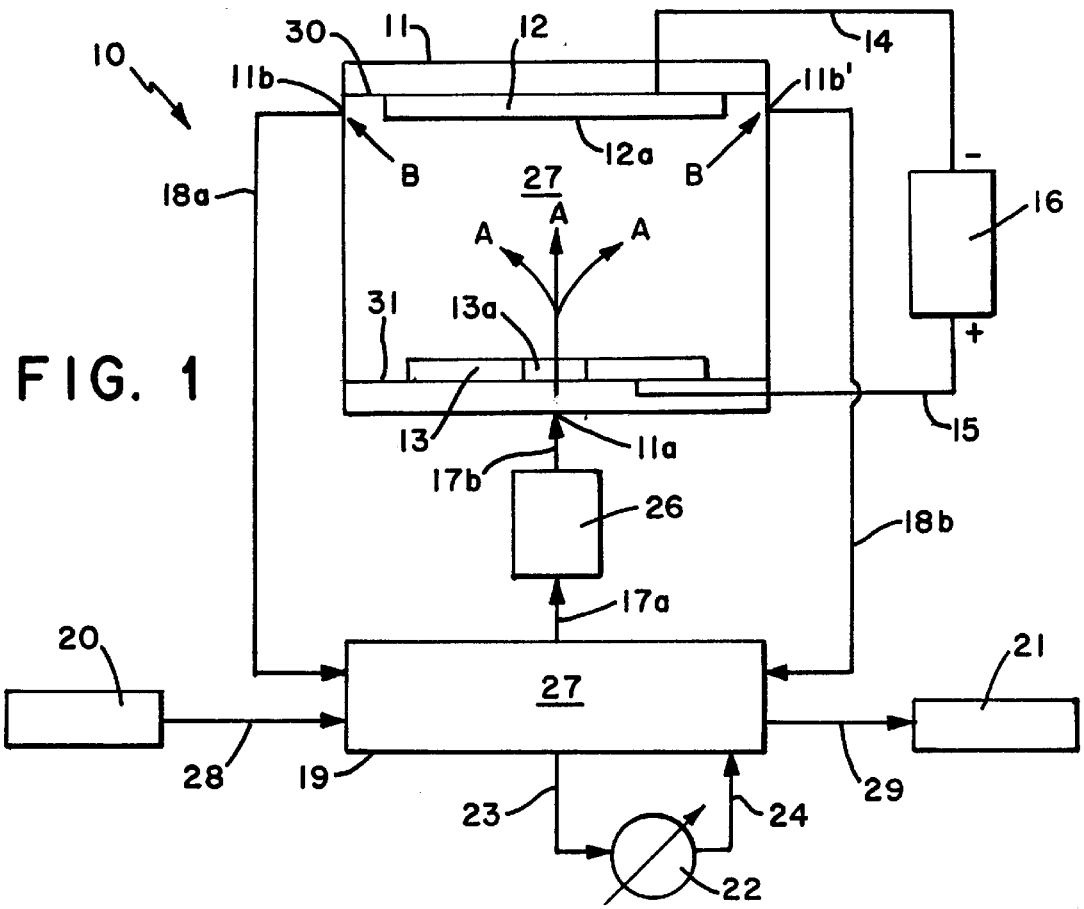
FIG. 1 is a schematic illustration of a copper electroplating apparatus of the invention using a holding tank for recycle of the copper electrolyte.

In describing the preferred embodiment of the present invention, reference will be made herein to FIGS. 1–2 of the drawings in which like numerals refer to like features of the invention. Features of the invention are not necessarily shown to scale in the drawings.

Referring to FIG. 1, a plating system of the invention is shown generally as 10 and is used for electroplating copper onto a substrate 12. The plating system 10 and method are described with reference to plating a silicon wafer using an insoluble anode but it will be appreciated by those skilled in the art that other substrates may be plated.

The preferred plating system 10 comprises an electroplating tank 11 which holds copper electrolyte 27 and which is made of a suitable material such as plastic or other material inert to the electrolytic plating solution. The tank is preferably cylindrical especially for wafer plating. A cathode 12 is horizontally disposed at the upper part of tank 11 and may be any type substrate such as a silicon wafer having openings such as trenches and vias. The wafer substrate 12a is typically coated with a seed layer of copper or other metal to initiate plating thereon. A copper seed layer may be applied by CVP, PVD and the like. An anode 13 is also preferably circular for wafer plating and is horizontally disposed at the lower part of tank 11 forming a space between the anode 13 and cathode 12. The anode 13 is an insoluble anode which is not consumed in the process. Suitable insoluble anodes include platinum and platinum metals including platinized titanium and platinized niobium and metal oxides, e.g., iridium oxide, ruthenium oxide, etc. coated on a substrate such as titanium.

The cathode substrate 12 and anode 13 are electrically connected by wiring 14 and 15, respectively, to a rectifier (power supply) 16. The cathode substrate 12 for direct current has a negative charge so that copper ions in the solution are reduced at the cathode substrate forming plated copper metal on the cathode surface 12a. An oxidation reaction takes place at anode 13 forming oxygen which migrates from the surface of the anode in the form of bubbles which rise in tank 11. The cathode 12 and anode 13 are shown horizontally disposed but may also be vertically disposed in the tank 11.

An electrolyte holding tank 19 contains copper electrolyte 27 which is recycled from holding tank 19 through line 17a, filter 26 and line 17b to the inlet 11a of electroplating tank 11. The electrolyte 27 as it enters the tank moves through an opening 13a in anode 13 and moves as shown by arrows A upward to the outlets 11b and 11b' of electroplating tank 11. The anode is positioned on plate 31. Arrows B show electrolyte being removed from holding tank 11 through outlets 11b and 11b' into recycle transfer lines 18a and 18b. It is preferred that outlets 11b and 11b' be proximate the edge of surface 12a of cathode 12 and more preferred that the outlet be a continuous opening around the periphery of the electroplating tank so that the flow of electrolyte impinging on the cathode surface is uniform across the cathode surface and the electrolyte overflows the opening and is directed to holding tank 19 for recycle. The electrolyte thus flows through the opening 13a in anode 13 and flows upward through tank 11 and impinges on cathode 12 as it exits the tank 11. A flange or plate 30 holds cathode 12 in position. As shown in the figure, electrolyte contacts only the upper side of anode 13 and only the lower side 12a of cathode 12. The outlet electrolyte is recycled to holding tank 19. During operation of the plating system to plate cathode substrate 12 with a layer of copper, the electrolyte 27 is preferably continuously recycled through holding tank 19 and electroplating tank 11. This forms a substantially uniform electrolyte composition in the system and contributes to the overall effectiveness of the substrate plating.

The copper electroplating bath may vary widely depending on the substrate to be plated and the type copper deposit desired. An acid bath is preferred and an exemplary copper plating bath because of its demonstrated effectiveness has a copper ion concentration of about 15 to 19 g/l and a copper sulfate concentration as the pentahydrate of 59 to 75 g/l. Sulfuric acid is present in an amount of about 150 to 225 g/l. Chloride ion may also be used in the bath at a level up to 90 mg/l. The bath also preferably contains an additive system for brightening, ductility and other copper plate properties.

During operation of the electroplating system 10, copper metal is plated on surface 12a of cathode substrate 12 when the rectifier 16 is energized. A pulse current, direct current, reverse periodic current or other suitable current may be employed. The electroplating process results in a depletion in the copper concentration of the copper electrolyte 27. The temperature of the electrolyte may be maintained using a heater/cooler 22 whereby electrolyte 27 is removed from holding tank 19 and flows through line 23, heater/cooler 22 and then recycled to holding tank 19 through line 24.

It is an important feature of the invention that the plating system and method of the invention be controlled by removing a portion of the electrolyte from the system when a predetermined operating parameter (condition) is met and new electrolyte is added to the system either simultaneously or after the removal in substantially the same amount. The new electrolyte is preferably a single liquid containing all the materials needed to maintain the electroplating bath and system. The addition/removal system of the invention maintains a steady-state constant plating system having enhanced plating effects such as constant plating properties. It has been found using the system and method of the invention that the plating bath reaches a steady state where bath components are substantially non-accumulating, e.g., reach a steady state value such as the sulfate concentration. The electrolyte is added as a copper containing solution having a copper concentration greater than the copper concentration of the electrolyte removed from the system and increases the copper concentration in the electrolyte in the system to a predetermined value, typically the initial copper value and/ or the copper value to be maintained. This removal and addition is accomplished by removing electrolyte 27 which is essentially homogenous from tank 19 through line 29 to container or tank 21. A copper containing solution is added to the holding tank 19 through line 28 from container or tank 20.

In one mode of operation, the electrolyte is removed and the copper containing solution added based on the operating parameter of the amount of copper plated in the system since the last removal/addition procedure. This can be determined in a number of ways such as amp-hours, copper weight, etc. In any event, when a certain amount of copper is plated, it is preferred that a certain amount of electrolyte be removed from the system and an equal amount of copper containing solution added to the system. It is preferred that the amount of copper added in the copper containing solution be equal to the amount plated on the substrate plus the amount removed in the removed stream. This will maintain the copper concentration within a range which can be controlled within certain limits depending on the plating characteristics desired. It is preferred that the concentration of copper in the electrolyte be maintained within about 3 g/l, preferably 2 g/l and most preferably 1 g/l or less of the desired copper concentration for wafer plating processes.

The copper used to make the electrolyte and the copper containing solution is preferably copper sulfate. It has been found that when the system and method of the invention is used with copper sulfate and a sulfate containing additive that the sulfate concentration of the bath is maintained at an effective operating level throughout the plating operation and the sulfate concentration does not need to be separately measured or controlled.

The copper containing solution will also contain an additive system which is the same additive system used in the electrolyte. The amount of additive which is used during the plating operation can be empirically determined and the value decreases over time during plating. It has also been found that using the system and method of the invention, when the amount of additive added in the copper containing solution is substantially equal to the amount of additive calculated to be used during the plating process plus the amount removed from the system in the removal stream, the additive level is maintained at the desired concentration or range in the electrolyte without the need for separate measurement or other process control. Accordingly, it is not necessary to measure the amount of additive in the electrolyte or perform other analytical measurements on the additive when using the method and plating system of the invention.

Figure 2:
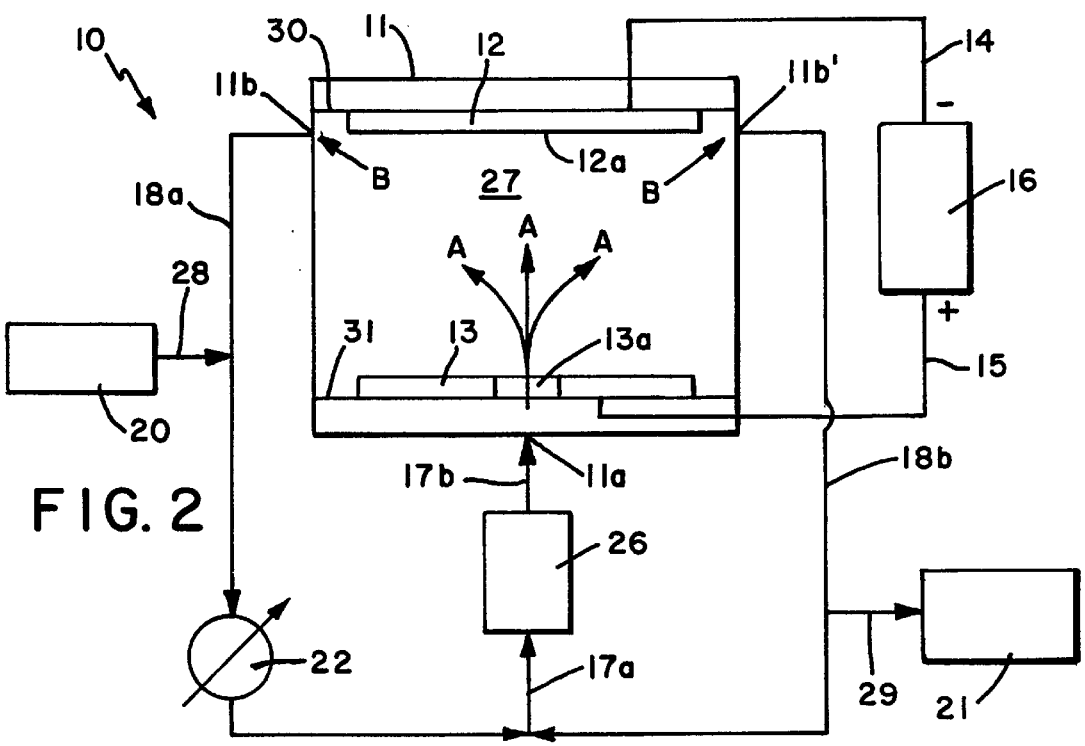
FIG. 2 is a schematic illustration of another copper electroplating apparatus of the invention.

Referring now to FIG. 2 which shows another plating system 10 of the invention, the plating system 10 is similar to the plating system of FIG. 1 except that a holding tank 19 is not employed. Thus, an electroplating tank 11 has therein a horizontally disposed cathode 12 and anode 13 separated by a space. Electrolyte 27 in the tank is circulated through the tank and removed through outlet lines 18a and 18b. The outlet from the tank is recycled to the inlet of the tank through line 17a, filter 26 and line 17b into tank 11 at inlet 11a. The flow of electrolyte 27 into the tank is shown by arrows A and electrolyte flow to outlets 11b and 11b' past cathode 12 as shown by arrows B. Anode 13 has a central opening 13a.

When a predetermined operating parameter is reached, electrolyte 27 is removed from the apparatus through line 29 into tank or container 21 and a copper containing solution in tank 20 is fed into outlet line 18a through line 28. A heater or cooler 22 is shown employed in line 18a.

Preferred insoluble anodes include platinum and platinum metal surfaces and oxides of iridium on a substrate such as titanium. Generally, these anodes are made by coating these compounds on a conducting substrate such as a titanium substrate. Other anodes may also be used in practice of the invention and comprise generally a Group VIII metal. Group VIII metals include cobalt, nickel, ruthenium, rhodium, palladium, iridium and platinum.

The invention may be practiced using a large variety of copper baths. The electrolytic baths include acid baths and alkaline baths. A variety of copper electroplating baths are described in the book entitled *Modern Electroplating*, edited by F. A. Lowenheim, John Reily & Sons, Inc., 1974, pages 183–203. Exemplary baths include copper fluoborate, copper pyrophosphate, copper cyanide, copper phosphonate and other copper metal chelates such as methane sulfonic acid and the preferred copper electroplating bath comprises copper sulfate in an acid solution. The concentration of copper and acid may vary over wide limits. For copper or copper ions, compositions generally vary up to 25 g/l or more preferably 15 to 20 g/l. The acid solution is typically sulfuric acid in an amount up to about 300 g/l or more, preferably 150 to 200 g/l. Chloride ions may be used in the bath at levels up to about 90 mg/l.

A large variety of additives are typically used in the bath to provide desired surface finishes for the copper plated metal. Usually more than one additive is used with each additive forming a desired function. The additives are generally used for improved metal plated appearance (brightness), ductility, structure and physical properties such as electrical conductivity. Particular additives (usually organic additives) are used for grain refinement, suppression of dendritic growth and improved covering and throwing power. Typical additives used in electroplating are discussed in a number of references including *Modern Electroplating*, cited above. A particularly desirable additive system uses a mixture of aromatic or aliphatic quaternary amines, polysulfide compounds, polyimines and polyethers. Other additives include metaloids such as selenium, tellurium and sulfur compounds.

Electrolysis conditions such as electric current concentration, applied voltage, electric current density, and electrolyte temperature may be essentially the same as those in conventional electrolytic copper plating methods. For example, the bath temperature is typically about room temperature such as about 20–27° C. but may be at elevated temperatures up to about 40° C. or higher. The current density is typically up to about 100 amps per square foot (ASF) typically about 15 to 40 ASF. It is preferred to use an anode to cathode ratio of about 2:1, but this may also vary widely from about 1:1 to 4:1. The method of the invention also uses mixing in the electroplating tank which may be supplied by agitation or preferably by the circulating flow of recycle electrolyte through the tank. In the preferred apparatus of the invention as shown in the Figures, the flow through the electroplating tank provides a residence time of electrolyte in the tank of less than about 1 minute typically less than 30 seconds, e.g., 10–20 seconds.

The copper containing solution which is added to the system to replenish the copper plated onto the substrate and removed from the system in the removal stream may be of any suitable concentration. It is preferred that the solution be a copper sulfate solution near the saturation level of copper sulfate pentahydrate, e.g., about 275 to 325 g/l, which is about 70–80 g/l as copper. As discussed hereinabove, the copper containing solution also contains in the amount to be used the amount of additive used during plating plus the amount removed in the removal stream. Regardless of the concentration of the copper in the copper containing solution, it is an important preferred aspect of the invention that a substantially equal amount of circulating electrolyte be removed from the system as is added to the system and more preferred that the amount added be minimized by using, for example, a concentrated copper containing solution. Using this addition/removal procedure maintains the electrolyte in a suitable condition for electroplating the substrate and provides a bath having a long life and enhanced operating and plating effects.

Various embodiments of the present invention will now be illustrated by reference to the following specific examples. This is to be understood, however, that such examples are presented for purposes of illustration only and the present invention is in no way to be deemed as limited thereby.

EXAMPLE 1

A copper electroplating working bath of about 1 gallon was prepared containing 67 g/l copper sulfate pentahydrate (17 g/l $Cu^{+2}$), 190 g/l $H_2SO_4$ and 8 ml/l additive system. A polished brass cathode substrate 2 inch×3 inch was hung vertically in the bath. A pair of platinized titanium anodes each 2 inch×6 inch (as submerged in the bath) were also hung vertically in the bath on each side of the cathode with a space of about 3 inch between the cathode and each anode. The bath was agitated using a magnetic stirrer. The bath temperature was maintained at about 21 to 27° C. A DC electric current at 25 amps/$ft^2$ (ASF) was employed.

A copper containing solution was prepared containing 75 g/l $Cu^{+2}$ (added as copper sulfate pentahydrate) and 235 ml/l of the same additive system.

After 6 grams of copper was plated from the gallon bath, 100 ml of the working electrolyte was removed and 100 ml of the copper containing solution added. This procedure was followed for 1 metal turnover (the time required to plate the initial copper in the electrolyte which is about 64 g of copper).

The copper bath was maintained in a material balance as follows. For every 6 g of copper plating, removal of 100 ml of electrolyte removes an additional 1.5 g copper from the working bath for a total of 7.5 g copper removed from the system. 100 ml of copper containing solution adds about 7.5 g copper to the bath. Likewise, for every 6 g copper plated, about 22.5 ml of additive is consumed and about 0.8 ml is removed in the electrolyte removal portion. 100 ml of the copper containing solution contains about 23.5 ml of the additive. The additive consumption was determined empirically.

Using the above procedure, essentially 100% plating efficiency was achieved (based on copper weight gain, plating current density and plating time). The copper concentration was maintained between about 15–17 g/l during the 1 metal turnover plating cycle. The total sulfate concentration decreased about 5%. Consistent, constant bright copper electroplating results were obtained.

EXAMPLE 2

A copper electroplating apparatus (basically as shown in FIG. 1) is used to electroplate copper on a 8 inch diameter silicon wafer having trenches and vias. The insoluble anode is about 8 inch diameter having a central opening for flow of electrolyte therethrough and is made of platinized titanium. The temperature of the bath is maintained at about 21–27° C. and the electrolyte is circulated through the apparatus at between about 15–25 liters/min providing a residence time in the electroplating tank of about 10–20 seconds. The electroplating tank holds about 4.5 liters and the total apparatus (including the holding tank) holds about 20 liters. A current density of about 25 ASF is employed and the copper bath is maintained in material balance by removing electrolyte from the apparatus and adding a copper containing solution to the apparatus as in Example 1.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An electrolytic method for copper plating a silicon wafer semiconductor substrate wherein electrolyte bath components are non-accumulating and reach a steady-state value comprising the steps of:

providing a plating system comprising a copper plating apparatus comprising a tank and containing a copper electrolyte comprising copper and an additive system for enhancing copper plating properties and a substrate to be plated as a cathode and a spaced apart insoluble anode;

agitating the copper electrolyte in the tank, while applying a current and electroplating the cathode;

measuring the weight of copper plated;

removing a portion of the electrolyte from the system when a predetermined weight of copper plated is met;

adding to the system either simultaneously with or after the electrolyte removal so that the volume of electrolyte in the system is substantially constant a replenishment copper and additive system containing solution, the solution having a copper concentration greater than the copper concentration in the removed electrolyte and an additive concentration greater than the additive concentration in the removed electrolyte and in an amount sufficient to increase the copper concentration and additive concentration of the electrolyte in the system to a predetermined value by replacing the copper and additive used in the plating process and removed in the removal portion; and maintaining the volume of electrolyte in the system at a substantially constant volume during the electroplating.

2. The method of claim 1 wherein the plating system comprises:

a copper plating tank and an electrolyte holding tank, the copper plating tank being cylindrical and having an inlet at the lower end of the tank and an outlet at the upper end of the tank and containing copper electrolyte and a substrate as a cathode and a spaced apart insoluble anode having a central opening therein both the cathode and anode being horizontal, the inlet and outlet positioned so that an electrolyte stream enters the plating tank proximate the anode and flows through the central opening toward the cathode and exits proximate the cathode; and agitating the electrolyte by circulating the copper electrolyte to the inlet of the apparatus from the holding tank and simultaneously removing the copper electrolyte from the outlet of the apparatus and directing the outlet copper electrolyte to the holding tank.

3. The method of claim 2 wherein the electrolyte and copper containing solution comprises copper sulfate and the copper containing solution contains copper in an amount of about 70–80 g/l.

4. The method of claim 3 wherein the anode to cathode ratio is about 1:1 to 4:1.

5. The method of claim 4 wherein the residence time of electrolyte in the copper plating tank is less than 1 minute.

6. The method of claim 1 wherein the copper containing solution is added using a single use container which contains the same amount of solution as the amount removed in the removal portion.

7. An apparatus for electrolytic copper plating a silicon wafer semiconductor substrate wherein electrolyte bath components are non-accumulating and reach a steady-state value, comprising:

an electroplating tank containing therein copper electrolyte comprising copper and an additive system for enhancing copper plating properties, a cathode adapted to support a substrate and a spaced apart insoluble anode, the tank having inlet means and outlet means;

agitating means for agitating the copper electrolyte in the tank by circulating the copper electrolyte through the electroplating tank from the inlet to the outlet, while applying a current and electroplating the cathode;

measuring means for measuring the weight of copper plated;

removal means for removing a portion of the electrolyte from the electroplating tank when a predetermined weight of copper is met; and addition means for adding to the electroplating tank either simultaneously with or after the electrolyte removal so that the volume of electrolyte is substantially constant a replenishment copper and additive system containing solution, the solution having a copper concentration greater than the copper concentration of the removed electrolyte and an additive concentration greater than the additive concentration in the removed electrolyte in an amount sufficient to increase the copper concentration and additive concentration of the electrolyte in the system to a predetermined value by replacing the copper and additive used in the plating process and removed in the removal portion and to maintain the volume of electrolyte in the tank at a substantially constant volume during the electroplating.

8. The apparatus of claim 7 further comprising an electrolyte holding tank from which electrolyte is pumped into an inlet of said inlet means of the electroplating tank and into which electrolyte is pumped from an outlet of said outlet means of the electroplating tank.

9. The apparatus of claim 8 wherein the anode is proximate the inlet and has an opening therein through which the circulating electrolyte passes.

10. The apparatus of claim 9 wherein the outlet means is proximate the cathode edge.

11. The apparatus of claim 10 wherein the outlet is a continuous opening around the periphery of the electroplating tank.

12. The apparatus of claim 7 wherein the anode has a central opening therein so that electrolyte entering the apparatus flows through the opening toward the cathode.

13. The apparatus of claim 7 wherein the addition means comprises a single use container containing the copper and additive solution.

* * * * *